United States Patent
Tian

(10) Patent No.: US 10,171,109 B2
(45) Date of Patent: Jan. 1, 2019

(54) FAST ENCODING METHOD AND DEVICE FOR REED-SOLOMON CODES WITH A SMALL NUMBER OF REDUNDANCIES

(71) Applicant: Hefei High-Dimensional Data Technology Co., Ltd., Hefei (CN)

(72) Inventor: Hui Tian, Hefei (CN)

(73) Assignee: Hefei High-Dimensional Data Technology Co., Ltd., Hefei (CN)

(*) Notice: Subject to any disclaimer, the term of this patent is extended or adjusted under 35 U.S.C. 154(b) by 35 days.

(21) Appl. No.: 15/621,116

(22) Filed: Jun. 13, 2017

(65) Prior Publication Data

US 2018/0212622 A1 Jul. 26, 2018

(30) Foreign Application Priority Data

Jan. 23, 2017 (CN) .......................... 2017 1 0058710
Jun. 5, 2017 (CN) .......................... 2017 1 0413990

(51) Int. Cl.
*H03M 13/11* (2006.01)
*G06F 11/10* (2006.01)
*H03M 13/15* (2006.01)
*H03M 13/00* (2006.01)

(52) U.S. Cl.
CPC ....... *H03M 13/118* (2013.01); *G06F 11/1096* (2013.01); *H03M 13/1515* (2013.01); *H03M 13/616* (2013.01)

(58) Field of Classification Search
CPC ............. H03M 13/118; H03M 13/616; H03M 13/6505; H03M 13/158; H03M 13/159; H03M 13/1515; G06F 11/08; G06F 11/1096

See application file for complete search history.

(56) References Cited

U.S. PATENT DOCUMENTS

| 8,255,765 B1* | 8/2012 | Yeo ........................ H03M 5/145 |
| | | 714/758 |
| 2005/0149832 A1* | 7/2005 | Liberol ............... H03M 13/158 |
| | | 714/781 |
| 2015/0155885 A1* | 6/2015 | Ikegaya .............. H03M 13/152 |
| | | 714/785 |

* cited by examiner

*Primary Examiner* — Shelly A Chase
(74) *Attorney, Agent, or Firm* — Shumaker, Loop & Kendrick, LLP

(57) ABSTRACT

Disclosed is a fast encoding method suitable for Reed-Solomon codes with a small number of redundancies including a step of setting parity-check matrices including presetting parity-check matrices $H_2$ and $H_3$ in which the number of redundant symbols s in the Reed-Solomon codes is 2 or 3. The method also includes a step of constructing the shortened Reed-Solomon codes including constructing (k, s) Reed-Solomon codes over a finite field $GF(2^m)$ that conform to the preset parity-check matrix; using k points $\{o_j\}_{j=1}^{k}$ in the R-points input $\{o_i\}_{i=0}^{R-1}$ as message symbols, and setting the remaining points to zero; a step of encoding including recursively processing the R-points input to obatin s redundant symbols, achieving the encoding of Reed-Solomon codes with a small number of redundancies. Embodiments of the present invention further include an electronic device and a computer-readable storage medium.

18 Claims, 5 Drawing Sheets

FAST ENCODING METHOD AND DEVICE FOR REED-SOLOMON CODES WITH A SMALL NUMBER OF REDUNDANCIES

TECHNICAL FIELD

The present invention relates to the field of encoding technique(s), in particular to a fast encoding method and device suitable for the Reed-Solomon codes with a small number of redundancies.

BACKGROUND

Reed-Solomon code (referred to as RS code hereinafter) is a type of maximum distance separable code, which now has been widely used in storage and communication systems. The current methods for encoding RS codes generally include polynomial division, matrix-vector multiplication-based and fast Fourier transform-based algorithms.

Wherein, with respect to the RS encoding based on the polynomial division, the generator polynomial is defined as: $g(X)=(X-a)(X-a^2) \ldots (X-a^s)$, where $g(X)$ is the generator polynomial, a is the primitive element of the finite field $GF(2^m)$, and s is the number of redundant symbols. Let $o=[o_1, o_2 \ldots o_k]$ denote k message symbols, and then the polynomial for message symbols is defined as $o(X)=o_1 o_2 X+ \ldots +o_k X^{k-1}$, and the redundant symbol polynomial $r(X)$ can be obtained by the formula: $r(X)=o(X)X^s \pmod{g(X)}$, where $r(X)$ is the remainder polynomial. However, the encoding based on polynomial division requires around sk finite field additions and sk finite field multiplications, and thus, the computational complexity is $O(sk \times M_q)$, where $M_q$ is the complexity of a multiplication/addition in a finite field.

For RS encoding based on matrix-vector multiplication, it requires a given generator matrix $G=[P\ I]$ where I is a k×k identity matrix, P is a given k×s matrix, s denotes the number of redundant symbols, and k denotes the number of message symbols. The codeword is defined as $c=oG=o[P\ I]=[oP\ o]$. In the formula, c is the codeword, o is the message symbol, and oP is a vector-matrix multiplication, the result vector of which consists of s check bits. The complexity of computing oP is the same as that of the polynomial division described above, and both of them are large.

For the RS encoding based on the fast Fourier transform, the constant term of such algorithms is relatively large, so it is not suitable for short RS codes.

For short RS codes, some researchers proposed the method of optimizing matrix-vector multiplication. For example, the Cauchy matrix is used to replace the Vandermonde matrix, and the finite field multiplication in the encoding process can be converted into exclusive OR (XOR) operations. However, these techniques do not change the structure of the matrix-vector multiplication, so the degree of optimization is limited and the computational complexity is still huge.

In order to reduce the amount of computation, some researchers proposed some other codes. These other codes are not RS codes, but both those codes and the RS codes belong to MDS codes. For example, when the number of redundant symbols s=2, there are EvenOdd, X-Code, RDP (Row-Diagonal Parity), P-Code, and so on. When s=3, there are Star Code, RTP (RAID triple parity), and so on. However, such methods can only correspond to the codes with a small number of redundant symbols, such as s=2, 3, and when s=3, those codes require at least three finite field additions.

It can be seen that, in the prior art, although there are encoding methods for reducing RS codes with a small number of redundancies (i.e., the short RS codes), the reduction of the computational complexity is limited and the computation speed is very slow.

SUMMARY

The object of the invention is to provide a fast Reed-Solomon encoding method and device for Reed-Solomon codes with a small number of redundancies in order to reduce the amount of computation.

The object of the invention is also to provide a computer-readable storage medium.

In order to achieve the above objects, an embodiment of the present invention provides a fast encoding method suitable for Reed-Solomon codes with a small number of redundancies, the method including:

a step of setting parity-check matrix comprising:

presetting parity-check matrices $H_2$ and $H_3$; where the number of redundant symbols s in the Reed-Solomon codes is 2 or 3, and when s is 3, the preset parity-check matrix is:

$$H_3 = \begin{bmatrix} 1 & 0 & 0 & 1 & 1 & \ldots & 1 \\ 0 & 1 & 0 & w_1 & w_2 & \ldots & w_k \\ 0 & 0 & 1 & w_1^2 & w_2^2 & \ldots & w_k^2 \end{bmatrix};$$

when s is 2, the preset parity-check matrix is:

$$H_2 = \begin{bmatrix} 1 & 0 & 1 & 1 & \ldots & 1 \\ 0 & 1 & w_1 & w_2 & \ldots & w_k \end{bmatrix};$$

a step of constructing shortened Reed-Solomon codes comprising:

constructing (k, s) RS codes over a finite field $GF(2^m)$ that conform to the preset parity-check matrix; using k points $\{o_i\}_{i=1}^{k}$ in the R-points input $\{o_i\}_{i=0}^{R-1}$ as message symbols, and setting the remaining points to zero; setting the remaining points of the R points to zero, i.e. $o_0=0$ and $o_{k+1}=\ldots=o_{R-1}=0$;

wherein m denotes the number of bits for each symbol, $R=2^r$, $r=\lceil \log_2(k+1) \rceil$, k is the number of message symbols, and s is the number of redundant symbols. For $i=0, 1, \ldots, R-1$, $o_i$ is the the message symbol:

a step of encoding comprising:

calculating s redundant symbols according to the R-points input and the base vector of the finite field to achieve the encoding of Reed-Solomon codes with a small number of redundancies.

An embodiment of the present invention also provides an electronic device suitable for fast encoding of Reed-Solomon codes with a small number of redundancies, the electronic device including a processor, a communication interface, a memory and a communication bus, among them, the processor, the communication interface and the memory communicating with each other through the communication bus;

the memory being used for storing computer programs;

the processor, when executing the programs stored in the memory, being used to implement the steps of the method described above.

An embodiment of the invention also provides a computer-readable storage medium, the computer-readable storage medium storing a computer program, the computer program being executed by the processor to implement the steps of the method described above.

Compared with the prior art, the present invention has the following technical effects: the invention performs fast encoding on a (k, s=2, 3) shortened RS code conforming to a particular parity-check matrix constructed over a finite field. The main idea is to convert the input of the shortened RS codes into the R-points input, where R is a multiple of 2; k message symbols are specified and the remaining points in the R points are set to 0, and then the R-points input is processed recursively; the R-points input is successively converted into R/2-points input, R/4-points input, until 2-points input; finally, calculate the redundant symbols of the shortened RS codes according to its 2-points input. Compared with the encoding method mentioned above, when the fast encoding method of the invention is applied to this class of shortened RS codes, the computational amount approximates two finite field additions, greatly reducing the computational amount; when this class of RS codes and the fast encoding method is applied in various communication systems or storage systems, it can effectively improve the performance and reduce the energy consumption.

BRIEF DESCRIPTION OF DRAWINGS

These and other features, aspects and advantages of the present invention are better understood when the following detailed description of the invention is read with reference to the accompanying drawings, in which.

DETAILED DESCRIPTION

The present invention will now be described in further detail with reference to FIGS. 1 to 6.

Figure 1:
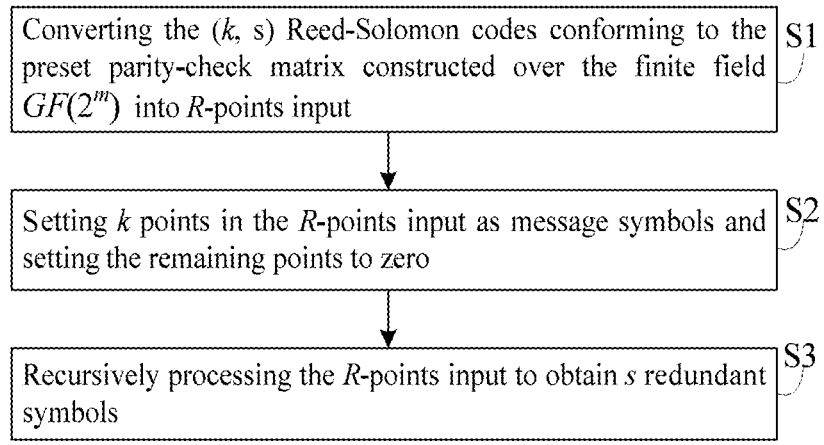
FIG. 1 is a schematic flow diagram of a fast encoding method for Reed-Solomon codes with a small number of redundancies provided by an embodiment of the present invention.

As shown in FIG. 1, this embodiment discloses a fast encoding method for Reed-Solomon codes with a small number of redundancies, and the method includes the following steps S1 to S3:

S1, the (k, s) Reed-Solomon codes conforming to the preset parity-check matrix constructed over the finite field $GF(2^m)$ is converted into R-points input $\{o_i\}_{i=0}^{R-1}$ by the shortening code technique, where m denotes the number of binary bits per symbol in the code, for example, m=8 means that each symbol in the code has 8 binary bits, $R=2^r$, $r=\lceil \log_2(k+1) \rceil$, k is the number of message symbols, s is the number of redundant symbols; in the present embodiment, s is chosen as 2 or 3: for i=0,1 , . . . , R−1, $o_i$ is the message symbol. Let $\{w_i | i=0,1, \ldots, 2^m-1\}$ denote the $2^m$ elements of $GF(2^m)$.

Wherein, when s is 3, the preset parity-check matrix $H_3$ is specifically:

$$H_3 = \begin{bmatrix} 1 & 0 & 0 & 1 & 1 & \ldots & 1 \\ 0 & 1 & 0 & w_1 & w_2 & \ldots & w_k \\ 0 & 0 & 1 & w_1^2 & w_2^2 & \ldots & w_k^2 \end{bmatrix};$$

when s is 2, the preset parity-check matrix is specifically:

$$H_2 = \begin{bmatrix} 1 & 0 & 1 & 1 & \ldots & 1 \\ 0 & 1 & w_1 & w_2 & \ldots & w_k \end{bmatrix};$$

wherein, $\{w_i | i=1,2, \ldots, k\}$ is k mutually different non-zero elements of $GF(2^m)$.

It is noted that, the above-mentioned $H_2$ and $H_3$ are provided as required by the present embodiment, but are not existing parity-check matrices. The fast encoding method disclosed in this embodiment is applicable to the (k≥1, s=2,3) shortened RS codes constructed over the finite field $GF(2^m)=F_2[X]/p(X)$, where $F_2[X]$ is the set of binary polynomials, and p(X) is the primitive polynomial. The number of message symbols is k, the number of redundant symbols is s, the code length is k+s, and $k \leq 2^m-1$.

Specifically, the RS codes conforming to the preset parity-check matrix in the present embodiment means that the codewords at certain positions in the original RS codes are replaced by 0, in order to shorten the length of the RS codes; the aforementioned "certain positions" may be any positions on the codewords, but in general, will be filled after the message symbols, and the number of "0" is R−k. And when the parity-check matrix of the shortened RS codes conforms to the preset parity-check matrix, it is possible to fast encode the shortened RS codes by using the fast encoding method disclosed in the present embodiment.

S2, shortening RS code: k points $\{o_i\}_{i=1}^{k}$ in the R-points input $\{o_i\}_{i=0}^{R-1}$ are used as message symbols, and the remaining points are set to zero; here, the conventional RS code shortening technology can be applied.

Wherein, the remaining points in the R points are set to zero, i.e. $o_0=0$ and $o_{k+1}=\ldots=o_{R-1}=0$.

S3, the R-points input is processed recursively to obtain s redundant symbols.

Figure 2:
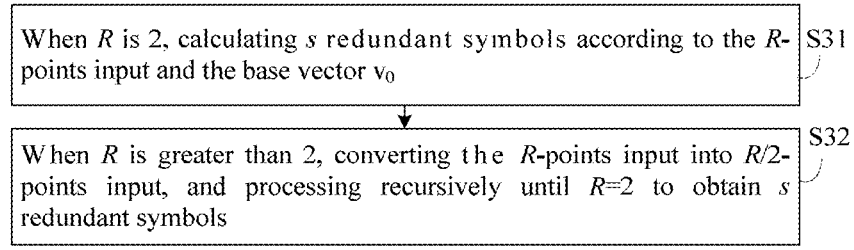
FIG. 2 is a schematic flow diagram of subdivision steps of step S3 in an embodiment of the invention.

Further, as shown in FIG. 2, step S3 specifically includes the following subdivision steps S31 to S32:

S31, when R is 2, the s redundant symbols are calculated according to the R-points input and the base vector $v_0$ of $GF(2^m)$.

S32, when R is greater than 2, the R-points input is converted into R/2-points input, and then is recursively processed according to the R-points input and the base vector $v_0$ of $GF(2^m)$ until R=2, in order to obtain s redundant symbols;

specifically, perform pairwise XOR operations on the points $\{o_i\}_{i=0}^{\frac{R}{2}-1}$ and $\{o_i\}_{i=\frac{R}{2}}^{R-1}$ of the R-points input in order, to convert the R-points input into R/2-points input; according to the same process, perform the recursive process on the R/2-points input to convert the R/2-points input into the R/2²-points input, in such a way, until the R-points input are converted to 2-points input.

Further, in step S1:

let $\{v_i\}_{i=0}^{m-1}$ denote a base of the finite field GF($2^m$). That is, for different i, different $\{v_i\}_{i=0}^{m-1}$ are mutually independent in GF($2^m$). The $2^m$ elements of the finite field GF($2^m$) are denoted by GF($2^m$)=$\{w_i|i=0,1,\ldots,2^m-1\}$, and each element is defined as $w_i=i_0v_0+i_1v_1+\ldots+i_{m-1}v_{m-1}$. Among them, $(i_{m-1}\ldots i_0)_2$ is the binary representation of i, that is, for $0\leq i\leq 2^{m-1}$, the binary representation of i is: $i=i_0+i_12+\ldots+i_{m-1}2^{m-1}$, and $i_0, i_1, \ldots, i_{m-1}\in\{0,1\}$.

When s is 2, the codeword of the RS code is c=[$p_0$ $p_1$ $o_1$ ... $o_k$], and when s is 3, the codeword of the RS code is c=[$p_0$ $p_1$ $p_2$ $o_1$ ... $o_k$].

Wherein, $\{o_i\in GF(2^m)|i=1,\ldots,k\}$ are message symbols, and $\{p_0, p_1, p_2\}$ are redundant symbols.

In particular, due to $Hc^T=0$, where H is the preset parity-check matrix, c is the codeword, $c^T$ is the transpose of the codeword, and according to the specific form of the preset parity-check matrix (i.e., the above-mentioned $H_3$), three redundant symbols can be calculated as:

$p_0=\Sigma_{i=1}^k o_i$;

$p_1=\Sigma_{i=1}^k w_i o_i$;

$p_2=\Sigma_{i=1}^k w_i^2 o_i$.

Figure 3:
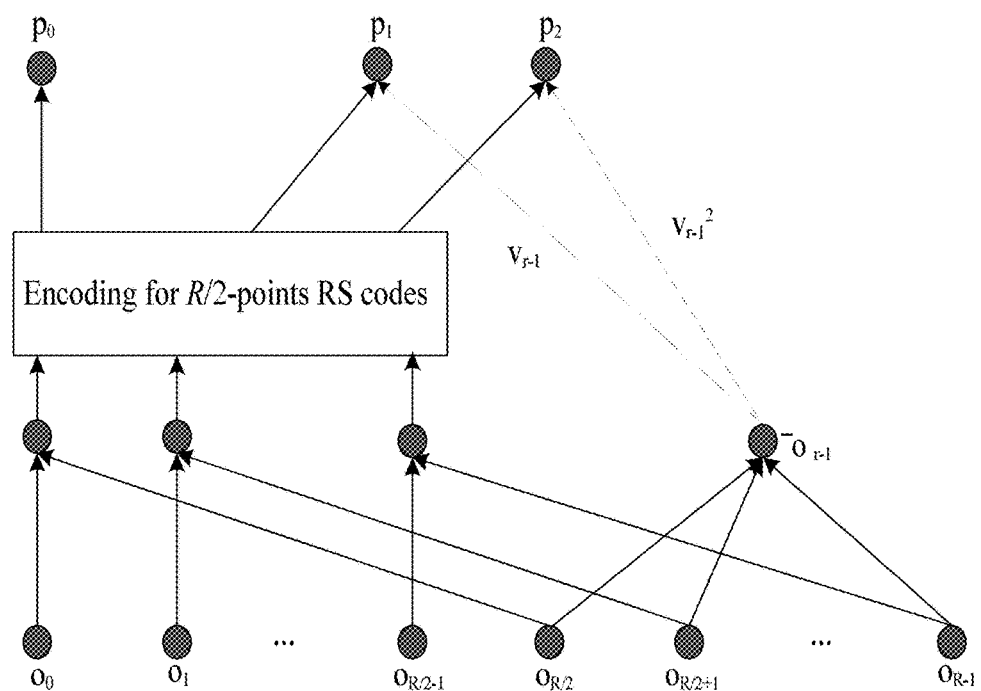
FIG. 3 is a schematic diagram of a recursive process for the R-points input of the RS codes in an embodiment of the invention.

Step S3 gives out a recursive algorithm to calculate $p_0$, $p_1$, $p_2$. Specifically, as shown in FIG. 3, the specific process for calculating the redundant symbols is as follows:

the above three formulas for redundant symbols are converted into:

$p_0=\Sigma_{i=0}^{R-1} o_i$ (1);

$p_1=\Sigma_{i=0}^{R-1} w_i o_i$ (2);

$p_2=\Sigma_{i=0}^{R-1} w_i^2 o_i$ (3).

Wherein $R=2^r$, $r=\lceil \log_2(k+1)\rceil$, and $o_0=0$, $o_{k+1}=o_{k+2}=\ldots=o_{R-1}=0$. Let $$o_i' = o_i + o_{i+\frac{R}{2}},$$

where $$i = 0, \ldots, \frac{R}{2}-1;$$

let $$\bar{o}_{r-1} = \sum_{j=0}^{\frac{R}{2}-1} o_{\frac{R}{2}+j},$$

where $$o_{\frac{R}{2}+j}$$

is the message symbol for the index (R/2)+j, $\bar{o}_{r-1}$ is the summation of all the symbols in the second half (i.e., starting from the index R/2) of the message symbols.

For $p_0$, according to the formulas $$o_i' = o_i + o_{i+\frac{R}{2}} \text{ and } \bar{o}_{r-1} = \sum_{j=0}^{\frac{R}{2}-1} o_{\frac{R}{2}+j},$$

the $p_0$ is calculated as:

$$p_0 = \sum_{i=0}^{R-1} o_i = \sum_{i=0}^{\frac{R}{2}-1} o_i + o_{\frac{R}{2}+1} = \sum_{i=0}^{\frac{R}{2}-1} o_i'; \quad (4)$$

for $p_1$, according to the formula $w_i=i_0v_0+i_1v_1+\ldots+i_{m-1}v_{m-1}$, it is obtained:

$$w_{\frac{R}{2}+i} = w_i + v_{r-1},$$

and $p_1$ is:

$$\begin{aligned} p_1 &= \sum_{i=0}^{R-1} w_i o_i = \sum_{i=0}^{\frac{R}{2}-1} w_i o_i + \sum_{i=0}^{\frac{R}{2}-1} w_{\frac{R}{2}+i} o_{\frac{R}{2}+i} \\ &= \sum_{i=0}^{\frac{R}{2}-1} w_i o_i + \sum_{i=0}^{\frac{R}{2}-1} (w_i + v_{r-1}) o_{\frac{R}{2}+i} \\ &= \sum_{i=0}^{\frac{R}{2}-1} w_i \left(o_i + o_{\frac{R}{2}+i}\right) + v_{r-1} \sum_{i=0}^{\frac{R}{2}-1} o_{\frac{R}{2}+i} \\ &= \sum_{i=0}^{\frac{R}{2}-1} w_i o_i' + v_{r-1} \bar{o}_{r-1}; \end{aligned} \quad (5)$$

for $p_2$:

$$\begin{aligned} p_2 &= \sum_{i=0}^{R-1} w_i^2 o_i = \sum_{i=0}^{\frac{R}{2}-1} w_i^2 o_i + \sum_{i=0}^{\frac{R}{2}-1} w_{\frac{R}{2}+i}^2 o_{\frac{R}{2}+i} \\ &= \sum_{i=0}^{\frac{R}{2}-1} w_i^2 o_i + \sum_{i=0}^{\frac{R}{2}-1} (w_i^2 + v_{r-1}^2) o_{\frac{R}{2}+i} \\ &= \sum_{i=0}^{\frac{R}{2}-1} w_i^2 \left(o_i + o_{\frac{R}{2}+i}\right) + v_{r-1}^2 \sum_{i=0}^{\frac{R}{2}-1} o_{\frac{R}{2}+i} \\ &= \sum_{i=0}^{\frac{R}{2}-1} w_i^2 o_i' + v_{r-1}^2 \bar{o}_{r-1}. \end{aligned} \quad (6)$$

Based on the above formulas, the input sequence $\{o_i\}_{i=0}^{R-1}$ whose size is R is converted into $\{o'_i\}_{i=0}^{R/2-1}$ of size R/2. Then process it recursively, until the size of the input is 2. Then, $p_0 = o_0 o_1$, $p_1 = w_1 o_1$, $p_2 = w_2 o_1$.

In addition, when s=2, the RS code has only 2 redundant symbols, and thus, one can directly calculate $p_0$, $p_1$.

The encoding of RS codes is to calculate the remainder of the message symbol polynomial divided by the check code generator polynomial. In the embodiment of the present application, through fast encoding the shortened RS codes (this class of shortened RS codes is k, s=2, 3) conforming to a particular parity-check matrix constructed over a finite field, the input of the shortened RS codes is converted into R-points input, where R is a multiple of 2, k message symbols are specified and the remaining points in R points are set to 0, and then the R-points input are processed recursively; the R-points input is then successively converted to R/2-points input, R/4-points input, until 2-points input; finally, the redundant symbols of the shortened RS codes are calculated based on the 2-points input. In particular, the fast encoding of Reed-Solomon codes with a small number of redundancies in the embodiment of the present invention comprises the following steps:

Step 701, the step of setting the parity-check matrix comprises:

presetting parity-check matrices $H_2$ and $H_3$; wherein the number of redundant symbols s in Reed-Solomon codes is 2 or 3, and when s is 3, the preset parity-check matrix is specifically:

$$H_3 = \begin{bmatrix} 1 & 0 & 0 & 1 & 1 & \ldots & 1 \\ 0 & 1 & 0 & w_1 & w_2 & \ldots & w_k \\ 0 & 0 & 1 & w_1^2 & w_2^2 & \ldots & w_k^2 \end{bmatrix};$$

when s is 2, the preset parity-check matrix is specifically:

$$H_2 = \begin{bmatrix} 1 & 0 & 1 & 1 & \ldots & 1 \\ 0 & 1 & w_1 & w_2 & \ldots & w_k \end{bmatrix};$$

step 702, the step of constructing shortened RS codes comprises:

constructing the (k, s) RS codes conforming to the preset parity-check matrix over a finite field GF($2^m$); k points $\{o_i\}_{i=1}^{k}$ in R-points input $\{o_i\}_{i=0}^{R-1}$ are treated as message symbols, and the remaining points are set to zero, i.e., $o_0 = 0$ and $o_{k+1} = \ldots = o_{R-1} = 0$;

wherein m denotes the number of binary bits for each symbol, $R = 2^r$, $r = \lceil \log_2(k+1) \rceil$, k is the number of message symbols, s is the number of redundant symbols; for i=0, 1, ..., R-1 $o_i$ is the message symbol;

step 703, the step of encoding comprises:

calculating s redundant symbols according to the R-points input and the base vector of the finite field, in order to perform the encoding of RS codes with a small number of redundancies.

For the above encoding step, it specifically includes the following steps:

let $RS_V(o_0, \ldots, o_{R-1})$ denote the encoding of RS codes, where $V = \{v_i\}_{i=0}^{m-1}$ is a base of the finite field GF($2^m$), and its output is s redundant symbols;

when R is 2, calculating s redundant symbols according to the R-points input, i.e. 2-points input, and the base vector $v_0$ of GF($2^m$).

Specifically, let $\{v_i\}_{i=0}^{m-1}$ denote a base of the finite field GF($2^m$), and the $2^m$ elements of the finite field GF($2^m$) are denoted as GF($2^m$)=$\{w_i | i = 0, 1, \ldots, 2^m - 1\}$, where each element is defined as $w_i = i_0 v_0 + i_1 v_1 + \ldots + i_{m-1} v_{m-1}$, and $(i_{m-1} \ldots i_0)_2$ is the binary representation of i; for $0 \leq i \leq 2^{m-1}$, the binary representation of i is; $i = i_0 + i_1 2 + \ldots + i_{m-1} 2^{m-1}$, and $i_0, i_1, \ldots, i_{m-1} \in \{0, 1\}$;

calculating $RS_V(o_0, o_1)$ according to the 2-points input and the base vector $v_0$, and output the s redundant symbols.

When R is greater than 2, the R-points input is converted into R/2-points input, and then recursively processing according to the R-points input and the base vector $v_o$ of GF($2^m$), until R=2, in order to obtain s redundant symbols;

wherein converting R-points input into R/2-points input is specifically: performing pairwise XOR operations on the points $$\{o_i\}_{i=0}^{\frac{R}{2}-1} \text{ and } \{o_i\}_{i=\frac{R}{2}}^{R-1}$$

of the R-points input in order, to convert the R-points input into the R/2-points input.

Wherein the recursive processing is recursively calculating $RS_V(o'_0, \ldots, o'_{R/2-1})$; during the recursive calculation, first calculating $RS_V(o'_0, \ldots, o'_{R/2-1})$, where the R/2-points input $\{o'_i\}_{i=0}^{R/2-1}$ is calculated based on $\{o_i\}_{i=0}^{R}$, then calculating the outputs of $RS_V(o'_0, \ldots, o'_{R/2-1})$, the value $\Sigma_{i=R/2}^{R-1} o_i$ and the base vector $v_{r-1}$ until R=2 for the input, to obtain s redundant symbols. The specific recursive calculation process can be found in FIG. 3.

When s is 2, the codeword of the RS codes is $c = [p_0 \ p_1 \ o_1 \ldots o_k]$, where $\{p_0, p_1\}$ is the redundant symbol.

When s is 3, the codeword of the RS codes is $c = [p_0 \ p_1 \ p_2 \ o_1 \ldots o_k]$, where $\{p_0, p_1, p_2\}$ denotes the rududant symbol.

Let $Hc^T = 0$, where H denotes the preset parity-check matrix, c is the codeword, $c^T$ is the transpose of the codeword, and the formulas for redundant symbol are:

$$p_0 = \Sigma_{i=0}^{R-1} o_i;$$

$$p_1 = \Sigma_{i=0}^{R-1} w_i o_i;$$

$$p_2 = \Sigma_{i=0}^{R-1} w_i^2 o_i;$$

where $R = 2^r$, $r = \lceil \log_2(k+1) \rceil$ and $o_0 = 0$, $o_{k+1} = o_{k+2} = \ldots = o_{R-1} = 0$; let $$o'_i = o_i + o_{i + \frac{R}{2}},$$

where $$i = 0, \ldots, \frac{R}{2} - 1;$$

let $$\overline{o}_{r-1} = \sum_{j=0}^{\frac{R}{2}-1} o_{\frac{R}{2}+j},$$

where $$o_{\frac{R}{2}+j}$$

is the message symbol of the index (R/2)+j, and $\bar{o}_{r-1}$ is the summation of all the message symbols starting from R/2.

Then the above three formulas for calculating redundant symbols are converted into formulas (1)-(3), and thereby obtain formulas (4)-(6), achieving the encoding of RS codes with a small number of redundancies.

Compared with the existing encoding methods, when the fast encoding method of the present invention is applied to this class of shortened RS codes, the computational amount approximates two finite field additions, greatly reducing the computational amount; when applied in various communication systems or storage systems, it can effectively improve the performance and reduce the energy consumption.

A specific implementation example will now be described with reference to the accompanying drawings.

Figure 4:
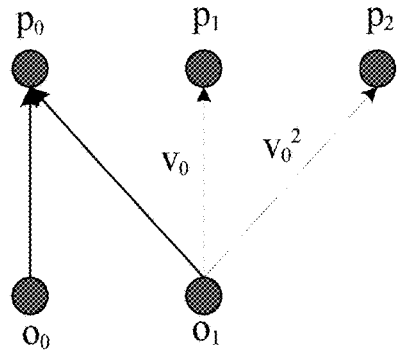
FIG. 4 is a schematic diagram of a recursive process for R=2-points input of the RS codes in an embodiment of the present invention.

Specifically, when R=2, its recursive structure is as shown in FIG. 4: wherein $p_0$ is obtained by adding $o_0$, $o_1$ in finite fields, $p_1$ is obtained by multiplying $o_1$ with $v_0$, and $p_2$ is obtained by multiplying $o_1$ with $v_0^2$. That is, when R=2, only one finite field addition is required in the case that the redundant symbols s=3, and this greatly reduces the computational amount.

Figure 5:
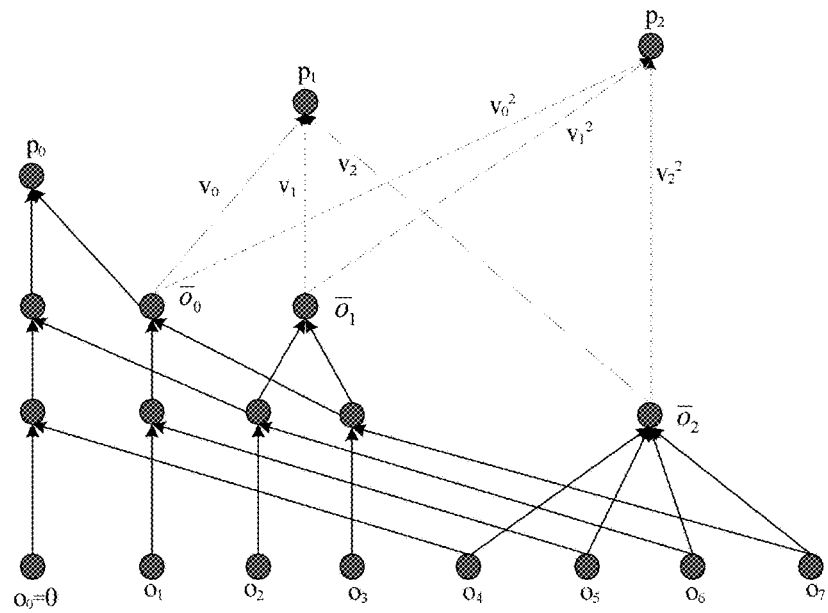
FIG. 5 is a schematic diagram of a recursive process for R=8-points input of the RS codes in an embodiment of the present invention.

Specifically, when R=8, its recursive structure is as shown in FIG. 5: the 8-points input is recursively processed to obtain the 2-points input, and $p_0$ is obtained by adding a certain point (as shown in FIG. 5) and $\bar{o}_0$ in the finite field; $\bar{o}_0$ is multiplied by $v_o$ in finite field, $\bar{o}_1$ is multiplied by $v_1$ in finite field, $\bar{o}_2$ is multiplied by $v_2$ in finite field, and the results of the above three multiplications in finite field are performed additions in finite field to obtain $p_1$; $\bar{o}_0$ is multiplied by $v_0^2$ in finite field, $\bar{o}_1$ is multiplied by $v_1^2$ in finite field, $\bar{o}_2$ is multiplied by $v_2^2$, and the results of the above three multiplications in finite field are performed additions in finite field to obtain $p_2$. That is, when R=8, only 14 additions in finite field and 6 multiplications in finite field are required in the case that redundant symbols s=3, greatly reducing the computational amount.

It is further noted that in this embodiment, the value of $o_0$ is zero.

It is noted that in the present embodiment, R=2 and R=8 are exemplified only, and the present embodiment does not limit the specific value of R. It is possible for the person skilled in the art to encode it according to the actual situation of the R value by using the fast encoding idea disclosed in the present embodiment.

Figure 6:
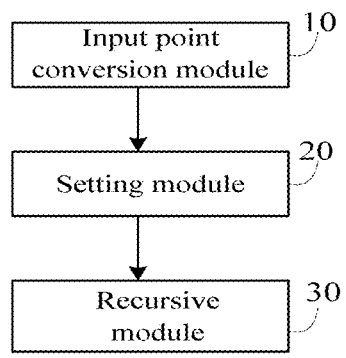
FIG. 6 is a schematic structure diagram of a fast encoding system suitable for Reed-Solomon codes with a small number of redundancies provided by an embodiment of the invention.

As shown in FIG. 6, the present embodiment discloses a fast encoding system suitable for Reed-Solomon codes with a small number of redundancies, which comprises:

an input point conversion module 10 used to convert the (k, s) RS codes conforming to the preset parity-check matrix constructed over the finite field $GF(2^m)$ into the R-points input $\{o_i\}_{i=0}^{R-1}$ by code shortening technique, where $R=2^r$, $r=\lceil \log_2(k+1) \rceil$, and s is 2 or 3; wherein, when s is 3, the preset parity-check matrix is specifically:

$$H_3 = \begin{bmatrix} 1 & 0 & 0 & 1 & 1 & \ldots & 1 \\ 0 & 1 & 0 & w_1 & w_2 & \ldots & w_k \\ 0 & 0 & 1 & w_1^2 & w_2^2 & \ldots & w_k^2 \end{bmatrix};$$

when s is 2, the preset parity-check matrix is specifically:

$$H_2 = \begin{bmatrix} 1 & 0 & 1 & 1 & \ldots & 1 \\ 0 & 1 & w_1 & w_2 & \ldots & w_k \end{bmatrix};$$

a setting module 20 connected to the input point conversion module 10 to set k points of the R-points input $\{o_i\}_{i=1}^{k}$ as message symbols and set the remaining points to zero;

an recursive module 30 connected to the setting module 20 to perform recursive process on the R-points input to obtain s redundant symbols.

Further, the recursive module 30 is specifically used to: when R is 2, calculate the s redundant symbols according to the R-points input and the base vector $v_0$ of $GF(2^m)$; when R is greater than 2, convert the R-points input into R/2-points input, and then recursively process it according to the R-points input and the base vector $v_0$ of $GF(2^m)$, until R=2, in order to obtain s redundant symbols.

It is noted that the fast encoding system for the Reed-Solomon codes with a small number redundancies disclosed in this embodiment and the fast encoding method for Reed-Solomon codes with a small number redundancies disclosed in the above embodiments possess the same or corresponding technical points, which will not be repeat here.

Figure 8:
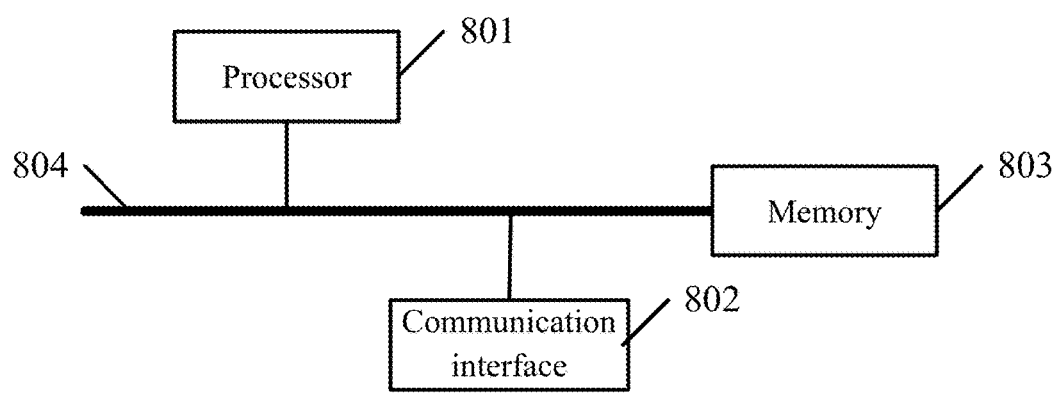
FIG. 8 is a schematic structure diagram of an electronic device provided by an embodiment of the invention.

An embodiment of the present invention also provides an electronic device suitable for fast encoding of Reed-Solomon codes with a small number of redundancies, as shown in FIG. 8, including a processor 801, a communication interface 802, a memory 803 and a communication bus 804, wherein the processor 801, the communication interface 802 and the memory 803 are communicated with each other through the communication bus 804;

the memory 803 used to store computer programs;

the processor 801 used to, when executing the programs stored in the memory 803, implement the following steps:

a step of setting the parity-check matrix comprising:

presetting parity-check matrices $H_2$ and $H_3$; wherein the number of redundant symbols s in Reed-Solomon code is 2 or 3, and when s is 3, the preset parity-check matrix is specifically:

$$H_3 = \begin{bmatrix} 1 & 0 & 0 & 1 & 1 & \ldots & 1 \\ 0 & 1 & 0 & w_1 & w_2 & \ldots & w_k \\ 0 & 0 & 1 & w_1^2 & w_2^2 & \ldots & w_k^2 \end{bmatrix};$$

when s is 2, the preset parity-check matrix is specifically:

$$H_2 = \begin{bmatrix} 1 & 0 & 1 & 1 & \ldots & 1 \\ 0 & 1 & w_1 & w_2 & \ldots & w_k \end{bmatrix};$$

a step of constructing the shortened RS codes comprising:

constructing the (k, s) RS codes conforming to the preset parity-check matrix over a finite field $GF(2^m)$; the k points $\{o_i\}_{i=1}^{k}$ in R-points input $\{o_i\}_{i=0}^{R-1}$ are used as message symbols, and the remaining points are set to zero; setting the remaining points of R points to zero, that is $o_0=0$ and $o_{k+1}=\ldots=o_{R-1}=0$;

wherein m denotes the number of binary bits for each symbol, $R=2^r$, $r=\lceil \log_2(k+1) \rceil$, k is the number of message symbols, s is the number of redundant symbols, i=0, 1, ..., R-1, and $o_i$ is the message symbol;

a step of encoding comprising:

calculating s redundant symbols according to the R-points input and the base vector over the finite field, in order to perform encoding of RS codes with a small number of redundancies.

The communication bus of the above-mentioned electronic device may be a Peripheral Component Interconnect (PCI) bus or an Extended Industry Standard Architecture (EISA) bus and so on. The communication bus can be divided into address bus, data bus, control bus and so on. For ease of representation, it is only represented by one thick line in the figures, but does not mean that there is only one bus or one type of bus.

The communication interface is used for communication between the above-mentioned electronic device and other devices.

The memory may include a random access memory (RAM), and may also include non-volatile memory (NVM), such as at least one disk memory. Optionally, the memory may also be at least one storage device located remotely from the aforementioned processor.

The above-mentioned processor may be a general processor including a central processing unit (CPU), a network processor (NP), etc.; it may also be a digital signal processor (DSP), an application specific integrated circuit (ASIC), a field programmable gate array (FPGA) or other programmable logic devices, discrete gate transistor logic devices or discrete hardware components.

As compared with the conventional encoding methods, when performing encoding of the shortened RS codes (the class of RS codes are k, s=2,3) by the above-mentioned device, the computational amount approximates two finite field additions, which greatly reduces the computational amount; when the device is used in various communication systems or storage systems, it can effectively improve performance and reduce energy consumption.

Figure 7:
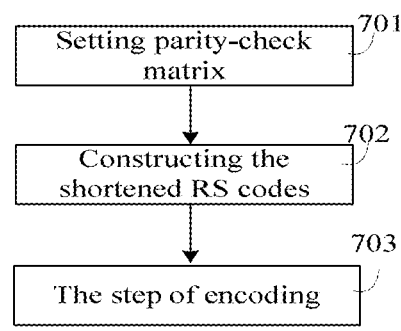
FIG. 7 is a schematic flow diagram of a fast encoding method for Reed-Solomon codes with a small number of redundancies provided by an embodiment of the present invention.

The embodiment of the invention also provides a computer-readable storage medium storing a computer program executed by the processor to implement the steps of the method described in FIG. 7.

Specifically, the RS codes with a small number of redundancies, such as 2 or 3, is mainly used in storage systems. For example, disk array RAID-6 is a storage technology based on RS codes with two redundancies, and further in some distributed storage systems, RS code is used to encode data to ensure data reliability and durability. On the other hand, RS code is also the base code for some erasure correcting codes. However, the encoding process of the general RS code requires a large amount of computation, so that the storage system requires greater energy consumption, higher hardware requirements and lower data throughput.

The fast encoding method and system for Reed-Solomon codes with a small number of redundancies disclosed by the invention can be used in various communication or storage systems to improve the efficiency of communication or storage systems and reduce energy consumption. For example, it can be used in a storage system with two or three redundant erasure codes to improve encoding speed.

The complexity of the fast encoding process disclosed by the embodiment is analyzed as follows:

let A(R) denote the number of required finite field additions for R-points algorithm, and M(R) denote the number of required finite field multiplications for R-points algorithm, and the following recursive formulas can be obtained according to the fast encoding procedure of this embodiment:

$$A(R) = A\left(\frac{R}{2}\right) + R + 1;$$

$$M(R) = M\left(\frac{R}{2}\right) + 2;$$

the solutions for the two recursive formulas are:

$A(R)=2R+\log_2(R)-4;$ $M(R)=2\log_2(R).$

Therefore, each input message symbol needs around $A(R)/R \approx 2$ finite field additions and $M(R)/R \approx 0$ finite field multiplications, in which the finite field addition is mainly implemented by XORs. Therefore, the fast encoding method in this embodiment requires around 2 XORs per input bit, as compared with the current MDS codes that requires at least 3 XORs, each input bit saving at least one XOR and increasing encoding speed of RS codes with a small number of redundancies.

It is noted that the term "includes", "contains" or any other variant of it is intended to encompass inclusive inclusion, so that the process, method, article or device that include a range of elements include not only those elements, but also other elements not explicitly listed, or elements inherent in the process, method, article or device. In the absence of more restrictions, the elements defined by the statement "including a . . . " do not preclude the existence of an additional same element in the process, method, article or device that include the elements.

Each embodiment in this specification is described in a related way, the same or similar parts between the various embodiments may be referred to each other, and each embodiment is focused on the difference from other embodiments. In particular, for the device embodiment, because it is basically similar to the method embodiment, the description is relatively simple, and the relevant part can be found in the partial description of the method embodiment.

The foregoing is intended only as a preferred embodiment of the invention, but is not used to restrict the invention, and any modification, equivalent substitution, improvement, etc., within the spirit and principle of the invention, shall be included in the scope of protection of the invention.

The invention claimed is:

1. A fast encoding method for Reed-Solomon codes with a small number of redundancies, the method comprising:

a step of setting parity-check matrices comprising:

presetting parity-check matrices $H_2$ and $H_3$; wherein the number of redundant symbols s in the Reed-Solomon codes is 2 or 3, and when s is 3, the preset parity-check matrix is:

$$H_3 = \begin{bmatrix} 1 & 0 & 0 & 1 & 1 & \ldots & 1 \\ 0 & 1 & 0 & w_1 & w_2 & \ldots & w_k \\ 0 & 0 & 1 & w_1^2 & w_2^2 & \ldots & w_k^2 \end{bmatrix};$$

when s is 2, the preset parity-check matrix is:

$$H_2 = \begin{bmatrix} 1 & 0 & 1 & 1 & \ldots & 1 \\ 0 & 1 & w_1 & w_2 & \ldots & w_k \end{bmatrix};$$

a step of constructing shortened Reed-Solomon codes comprising:

constructing (k, s) Reed-Solomon codes over a finite field $GF(2^m)$ that conform to the preset parity-check matrix; using k points $\{o_i\}_{i=1}^{k}$ in R-points input $\{o_i\}_{i=0}^{R-1}$ as message symbols, and setting the remaining points to zero; setting the remaining points of the R points to zero, that is, $o_0=0$ and $o_{k+1}=\ldots=o_{R-1}=0$;

wherein m denotes the number of binary bits for each symbol, $R=2^r$, $r=\lceil \log_2(k+1) \rceil$, k denotes the number of message symbols, s denotes the number of redundant symbols, $i=0,1,\ldots,R-1$, and $o_i$ denotes the message symbol;

a step of encoding comprising:

calculating s redundant symbols according to the R-points input and the base vector of the finite field, to achieve the encoding of Reed-Solomon codes with a small number of redundancies.

2. The method according to claim 1, wherein the step of calculating s redundant symbols according to the R-points input and the base vector of the finite field comprises:

letting $RS_V(o_0,\ldots,o_{R-1})$ denote the encoding of Reed-Solomon codes, where $V=\{v_i\}_{i=0}^{m-1}$ denotes a base of the finite field $GF(2^m)$, and output is s redundant symbols; $2^m$ elements of the finite field $GF(2^m)$ being denoted as $GF(2^m)=\{w_i|i=0,1,\ldots,2^m-1\}$, where each element is defined as $w_i=i_0v_0+i_1v_1+\ldots+i_{m-1}v_{m-1}$, $(i_{m-1}\ldots i_0)_2$ is the binary representation of i, for $0\le i\le 2^{m-1}$, the binary representation of i is: $i=i_0+i_1 2+\ldots+i_{m-1}2^{m-1}$ and $i_0, i_1,\ldots,i_{m-1}\in\{0,1\}$;

when R is 2, calculating s redundant symbols according to the R-points input and the base vector $v_0$ of $GF(2^m)$, in particular, calculating $RS_V(o_0, o_1)$ and outputting the s redundant symbols;

when R is greater than 2, converting the R-points input into R/2-points input, and recursively processing until R=2 to obtain s redundant symbols.

3. The method according to claim 2, wherein the step of converting the R-points input into R/2-points input comprises:

performing pairwise XOR operations on the points $$\{o_i\}_{i=0}^{\frac{R}{2}-1} \text{ and } \{o_i\}_{i=\frac{R}{2}}^{R-1}$$

of the R-points input in order, to convert the R-points input into R/2-points input.

4. The method according to claim 2, wherein when R is greater than 2, the step of converting the R-points input into R/2-points input, and recursively processing until R=2 to obtains redundant symbols comprises:.

firstly calculating $RS_V(o'_0,\ldots,o'_{R/2-1})$, where the R/2-points input $\{o'_i\}_{i=0}^{R/2-1}$ is calculated based on $\{o_i\}_{i=0}^{R}$, then calculating outputs of $RS_V(o'_0,\ldots,o'_{R/2-1})$, the value $\Sigma_{i=R/2}^{R-1}o_i$ and the base vector $v_{r-1}$ until R=2 to obtain the s redundant symbols.

5. The method according to claim 2, wherein when s is 2, the codeword of the Reed-Solomon codes is $c=[p_0\ p_1\ o_1\ \ldots\ o_k]$, where $\{p_0, p_1\}$ denotes the redundant symbols;

when s is 3, the codeword of the Reed-Solomon codes is $c=[p_0\ p_1\ p_2\ o_1\ \ldots\ o_k]$, where $\{p_0, p_1, p_2\}$ denotes the redundant symbols.

6. The method according to claim 5, wherein $Hc^T=0$, where H denotes the preset parity-check matrix, c denotes the codeword, $c^T$ denotes the transpose of the codeword, and the formulas for calculating the redundant symbols are:

$$p_0=\Sigma_{i=0}^{R-1}o_i;$$

$$p_1=\Sigma_{i=0}^{R-1}w_io_i;$$

$$p_2=\Sigma_{i=0}^{R-1}w_i^2o_i;$$

where $R=2^r$, $r=\lceil \log_2(k+1) \rceil$, and $o_0=0$, $o_{k+1}=o_{k+2}=\ldots=o_{R-1}=0$, letting $$o'_i = o_i + o_{i+\frac{R}{2}},$$

where $$i = 0,\ldots,\frac{R}{2}-1;$$

letting $$\overline{o}_{r-1} = \sum_{j=0}^{\frac{R}{2}-1} o_{\frac{R}{2}+j};$$

where $$o_{\frac{R}{2}+j}$$

denotes the message symbol of the index (R/2)+j, and $\overline{o}_{r-1}$ is the summation of all the message symbols starting from R/2.

7. An electronic device for fast encoding of Reed-Solomon codes with a small number of redundancies, the electronic device comprising a processor, a communication interface, a memory and a communication bus, wherein the processor, the communication interface and the memory communicate with each other through the communication bus;

the memory being used to store computer programs;

the processor being used to, when executing the programs stored in the memory, implement the steps of:

setting parity-check matrices, comprising:

presetting parity-check matrices $H_2$ and $H_3$; wherein the number of redundant symbols s in the Reed-Solomon codes is 2 or 3, and when s is 3, the preset parity-check matrix is:

$$H_3 = \begin{bmatrix} 1 & 0 & 0 & 1 & 1 & \ldots & 1 \\ 0 & 1 & 0 & w_1 & w_2 & \ldots & w_k \\ 0 & 0 & 1 & w_1^2 & w_2^2 & \ldots & w_k^2 \end{bmatrix};$$

when s is 2, the preset parity-check matrix is:

$$H_2 = \begin{bmatrix} 1 & 0 & 1 & 1 & \ldots & 1 \\ 0 & 1 & w_1 & w_2 & \ldots & w_k \end{bmatrix};$$

constructing shortened Reed-Solomon codes, comprising:
constructing (k, s) Reed-Solomon codes over a finite field $GF(2^m)$ that conform to the preset parity-check matrix; using k points $\{o_i\}_{i=1}^k$ in R-points input $\{o_i\}_{i=0}^{R-1}$ as message symbols, and setting the remaining points to zero; setting the remaining points of the R points to zero, that is, $o_0=0$ and $o_{k+1}=\ldots=o_{R-1}=0$;

wherein m denotes the number of binary bits for each symbol, $R=2^r$, $r=\lceil \log_2(k+1) \rceil$, k denotes the number of message symbols, s denotes the number of redundant symbols, $i=0,1,\ldots,R-1$, and $o_i$ denotes the message symbol;

encoding, comprising:
calculating s redundant symbols according to the R-points input and the base vector of the finite field, to achieve the encoding of Reed-Solomon codes with a small number of redundancies.

8. The electronic device according to claim 7, wherein the step of calculating s redundant symbols according to the R-points input and the base vector of the finite field comprises:

letting $RS_V(o_0, \ldots, o_{R-1})$ denote the encoding of Reed-Solomon codes, where $V=\{v_i\}_{i=0}^{m-1}$ denotes a base of the finite field $GF(2^m)$, and output is s redundant symbols; $2^m$ elements of the finite field $GF(2^r)$ being denoted as $GF(2^m)=\{w_i|i=0,1,\ldots,2^m-1\}$, where each element is defined as $w_i=i_0v_0+i_1v_1+\ldots+i_{m-1}v_{m-1}$, $(i_{m-1}\ldots i_0)_2$ is the binary representation of i, for $0 \leq i \leq 2^{m-1}$, the binary representation of i is: $i=i_0+i_1 2+\ldots+i_{m-1}2^{m-1}$ and $i_0, i_1, \ldots, i_{m-1} \in \{0,1\}$;

when R is 2, calculating s redundant symbols according to the R-points input and the base vector $v_0$ of $GF(2^m)$, in particular, calculating $RS_V(o_0, o_1)$ and outputting the s redundant symbols;

when R is greater than 2, converting the R-points input into R/2-points input, and recursively processing until R=2 to obtain s redundant symbols.

9. The electronic device according to claim 8, wherein the step of converting the R-points input into R/2-points input comprises:
performing pairwise XOR operations on the points $$\{o_i\}_{i=0}^{\frac{R}{2}-1} \text{ and } \{o_i\}_{i=\frac{R}{2}}^{R-1}$$

of the R-points input in order, to convert the R-points input into R/2-points input.

10. The electronic device according to claim 8, wherein when R is greater than 2, the step of converting the R-points input into R/2-points input, and recursively processing until R=2 to obtain s redundant symbols comprises:
firstly calculating $RS_V(o'_0, \ldots, o'_{R/2-1})$, where the R/2-points input $\{o'_i\}_{i=0}^{R/2-1}$ is calculated based on $\{o_i\}_{i=0}^R$, then calculating outputs of $RS_V(o'_0, \ldots, o'_{R/2-1})$, the value $\sum_{i=R/2}^{R-1} o_i$ and the base vector $v_{r-1}$ until R=2 to obtain the s redundant symbols.

11. The electronic device according to claim 8, wherein
when s is 2, the codeword of the Reed-Solomon codes is $c=[p_0\ p_1\ o_1\ \ldots\ o_k]$, where $\{p_0, p_1\}$ denotes the redundant symbols;
when s is 3, the codeword of the Reed-Solomon codes is $c=[p_0\ p_1\ p_2\ o_1\ \ldots\ o_k]$, where $\{p_0, p_1, p_2\}$ denotes the redundant symbols.

12. The method according to claim 11, wherein
$Hc^T=0$, where H denotes the preset parity-check matrix, c denotes the codeword, $c^T$ denotes the transpose of the codeword, and the formulas for calculating the redundant symbols are:

$$p_0=\Sigma_{i=0}^{R-1} o_i;$$

$$p_1=\Sigma_{i=0}^{R-1} w_i o_i;$$

$$p_2=\Sigma_{i=0}^{R-1} w_i^2 o_i;$$

where $R=2^r$, $r=\lceil \log_2(k+1) \rceil$, and $o_0=0$, $o_{k+1}=o_{k+2}=\ldots=o_{R-1}=0$, letting $$o'_i = o_i + o_{i+\frac{R}{2}},$$

where $$i = 0, \ldots, \frac{R}{2} - 1;$$

letting $$\overline{o}_{r-1} = \sum_{j=0}^{\frac{R}{2}-1} o_{\frac{R}{2}+j},$$

where $$o_{\frac{R}{2}+j}$$

denotes the message symbol of the index (R/2)+j, and $\overline{o}_{r-1}$ is the summation of all the message symbols starting from R/2.

13. A computer-readable storage medium configured to store a computer program that implements, by a processor, the steps of:
setting parity-check matrices, comprising:
presetting parity-check matrices $H_2$ and $H_3$; wherein the number of redundant symbols s in the Reed-Solomon codes is 2 or 3, and when s is 3, the preset parity-check matrix is:

$$H_3 = \begin{bmatrix} 1 & 0 & 0 & 1 & 1 & \ldots & 1 \\ 0 & 1 & 0 & w_1 & w_2 & \ldots & w_k \\ 0 & 0 & 1 & w_1^2 & w_2^2 & \ldots & w_k^2 \end{bmatrix};$$

when s is 2, the preset parity-check matrix is:

$$H_2 = \begin{bmatrix} 1 & 0 & 1 & 1 & \ldots & 1 \\ 0 & 1 & w_1 & w_2 & \ldots & w_k \end{bmatrix};$$

constructing shortened Reed-Solomon codes, comprising:
  constructing (k, s) Reed-Solomon codes over a finite field $GF(2^m)$ that conform to the preset parity-check matrix; using k points $\{o_i\}_{i=1}^{k}$ in R-points input $\{o_i\}_{i=0}^{R-1}$ as message symbols, and setting the remaining points to zero; setting the remaining points of the R points to zero, that is, $o_0=0$ and $o_{k+1}=\ldots=o_{R-1}=0$;
  wherein m denotes the number of binary bits for each symbol, $R=2^r$, $r=\lceil \log_2(k+1) \rceil$, k denotes the number of message symbols, s denotes the number of redundant symbols, $i=0,1,\ldots,R-1$, and $o_i$ denotes the message symbol;
  encoding, comprising:
    calculating s redundant symbols according to the R-points input and the base vector of the finite field, to achieve the encoding of Reed-Solomon codes with a small number of redundancies.

14. The computer-readable storage medium according to claim 13, wherein the step of calculating s redundant symbols according to the R-points input and the base vector of the finite field comprises:
  letting $RS_V(o_0,\ldots,o_{R-1})$ denote the encoding of Reed-Solomon codes, where $V=\{v_i\}_{i=0}^{m-1}$ denotes a base of the finite field $GF(2^m)$, and output is s redundant symbols; $2^m$ elements of the finite field $GF(2^m)$ being denoted as $GF(2^m)=\{w_i|i=0,1,\ldots,2^m-1\}$, where each element is defined as $w_i=i_0v_0+i_1v_1+\ldots+i_{m-1}v_{m-1}$, $(i_{m-1}\ldots i_0)_2$ is the binary representation of i, for $0\le i\le 2^{m-1}$, the binary representation of i is: $i=i_0+i_1 2+\ldots+i_{m-1}2^{m-1}$ and $i_0, i_1, \ldots, i_{m-1} \in\{0,1\}$;
  when R is 2, calculating s redundant symbols according to the R-points input and the base vector $v_0$ of $GF(2^m)$, in particular, calculating $RS_V(o_0, o_1)$ and outputting the s redundant symbols;
  when R is greater than 2, converting the R-points input into R/2-points input, and recursively processing until R=2 to obtain s redundant symbols.

15. The computer-readable storage medium according to claim 14, wherein the step of converting the R-points input into R/2-points input comprises:
  performing pairwise XOR operations on the points $$\{o_i\}_{i=0}^{\frac{R}{2}-1} \text{ and } \{o_i\}_{i=\frac{R}{2}}^{R-1}$$

of the R-points input in order, to convert the R-points input into R/2-points input.

16. The computer-readable storage medium according to claim 14, wherein when R is greater than 2, the step of converting the R-points input into R/2-points input, and recursively processing until R=2 to obtain s redundant symbols comprises:.

firstly calculating $RS_V(o'_0,\ldots,o'_{R/2-1})$, where the R/2-points input $\{o'_i\}_{i=0}^{R/2-1}$ is calculated based on $\{o_i\}_{i=0}^{R}$, then calculating outputs of $RS_V(o'_0,\ldots,o'_{R/2-1})$, the value $\Sigma_{i=R/2}^{R-1}o_i$ and the base vector $v_{r-1}$ until R=2 to obtain the s redundant symbols.

17. The computer-readable storage medium according to claim 14, wherein
  when s is 2, the codeword of the Reed-Solomon codes is $c=[p_0\ p_1\ o_1\ \ldots\ o_k]$, where $\{p_0, p_1\}$ denotes the redundant symbols;
  when s is 3, the codeword of the Reed-Solomon codes is $c=[p_0\ p_1\ p_2\ o_1\ \ldots\ o_k]$, where $\{p_0, p_1, p_2\}$ denotes the redundant symbols.

18. The computer-readable storage medium according to claim 17, wherein
  $Hc^T=0$, where H denotes the preset parity-check matrix, c denotes the codeword, $c^T$ denotes the transpose of the codeword, and the formulas for calculating the redundant symbols are:

$$p_0=\Sigma_{i=0}^{R-1}o_i;$$

$$p_1=\Sigma_{i=0}^{R-1}w_i o_i;$$

$$p_2=\Sigma_{i=0}^{R-1}w_i^2 o_i;$$

where $R=2^r$, $r=\lceil \log_2(k+1) \rceil$, and $o_0=0$, $o_{k+1}=o_{k+2}=\ldots=o_{R-1}=0$, letting $$o'_i = o_i + o_{i+\frac{R}{2}},$$

where $$i = 0, \ldots, \frac{R}{2} - 1;$$

letting $$\overline{o}_{r-1} = \sum_{j=0}^{\frac{R}{2}-1} o_{\frac{R}{2}+j},$$

where $$o_{\frac{R}{2}+j}$$

denotes the message symbol of the index (R/2)+j, and $\overline{o}_{r-1}$ is the summation of all the message symbols starting from R/2.

* * * * *